US009147490B2

(12) United States Patent
Dusija et al.

(10) Patent No.: US 9,147,490 B2
(45) Date of Patent: Sep. 29, 2015

(54) SYSTEM AND METHOD OF DETERMINING READING VOLTAGES OF A DATA STORAGE DEVICE

(71) Applicant: SANDISK TECHNOLOGIES INC., Plano, TX (US)

(72) Inventors: Gautam Dusija, San Jose, CA (US); Jianmin Huang, San Carlos, CA (US); Chris Avila, Saratoga, CA (US); Eran Sharon, Rishon Lezion (IL); Idan Alrod, Herzliya (IL); Evgeny Mekhanik, Rehovot (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 13/839,430

(22) Filed: Mar. 15, 2013

(65) Prior Publication Data
US 2014/0269052 A1 Sep. 18, 2014

(51) Int. Cl.
| G11C 16/04 | (2006.01) |
| G11C 16/34 | (2006.01) |
| G11C 11/56 | (2006.01) |
| G11C 16/26 | (2006.01) |

(52) U.S. Cl.
CPC ............ *G11C 16/34* (2013.01); *G11C 11/5642* (2013.01); *G11C 16/26* (2013.01)

(58) Field of Classification Search
CPC ............ G06F 11/1068; G06F 11/1072; G11C 16/349; G11C 11/5628; G11C 16/3418; G11C 29/50; G11C 29/50004; G11C 2211/5641; G11C 2211/5646
USPC ............... 365/185.03, 185.09, 185.2, 185.18; 711/103; 714/773, 763
See application file for complete search history.

(56) References Cited

U.S. PATENT DOCUMENTS

| 6,456,528 | B1 | 9/2002 | Chen | |
| 7,948,798 | B1 | 5/2011 | Sheredy et al. | |
| 8,072,805 | B2* | 12/2011 | Chou et al. | 365/185.03 |
| 8,116,141 | B2* | 2/2012 | Yoo et al. | 365/185.24 |
| 2009/0080259 | A1 | 3/2009 | Alrod et al. | |
| 2009/0199074 | A1 | 8/2009 | Sommer | |
| 2009/0292972 | A1* | 11/2009 | Seol et al. | 714/763 |
| 2009/0323422 | A1* | 12/2009 | Alrod et al. | 365/185.18 |
| 2010/0131697 | A1* | 5/2010 | Alrod et al. | 711/103 |
| 2010/0174845 | A1 | 7/2010 | Gorobets et al. | |

(Continued)

OTHER PUBLICATIONS

Invitation to Pay Additional Fees, and, Where Applicable, Protest Fee and Partial International Search Report mailed Aug. 11, 2014 in International Application No. PCT/US2014/023444, 5 pages.
International Search Report and Written Opinion of the International Searching Authority for International Application No. PCT/US2014/023444, mailed Oct. 22, 2014.

*Primary Examiner* — Thong Q Le
(74) *Attorney, Agent, or Firm* — Toler Law Group, PC (57) ABSTRACT

A data storage device includes a memory and a controller. In a particular embodiment, a method is performed in the data storage device. The method is performed during a read threshold voltage update operation and includes determining a first read threshold voltage of a set of storage elements of a memory according to a first technique and determining a second read threshold voltage of the set of storage elements of the memory according to a second technique. The first read threshold voltage is different from the second read threshold voltage, and the first technique is different from the second technique.

24 Claims, 4 Drawing Sheets

(56) References Cited

U.S. PATENT DOCUMENTS

| | | |
|---|---|---|
| 2010/0174847 A1 | 7/2010 | Paley et al. |
| 2010/0309726 A1 | 12/2010 | Yang |
| 2011/0066902 A1 | 3/2011 | Sharon et al. |
| 2011/0134692 A1* | 6/2011 | Sharon et al. ............ 365/185.2 |
| 2012/0166913 A1* | 6/2012 | Alrod et al. ................ 714/773 |

* cited by examiner

IN A DATA STORAGE DEVICE INCLUDING A CONTROLLER AND A FLASH MEMORY, DURING A READ THRESHOLD VOLTAGE OPERATION, DETERMINE A FIRST READ THRESHOLD VOLTAGE OF A SET OF STORAGE ELEMENTS OF A MULTI-LEVEL CELL MEMORY ACCORDING TO A FIRST TECHNIQUE

304

DETERMINE A SECOND READ THRESHOLD VOLTAGE OF THE SET OF STORAGE ELEMENTS OF THE MULTI-LEVEL CELL MEMORY ACCORDING TO A SECOND TECHNIQUE, WHERE THE FIRST READ THRESHOLD VOLTAGE IS DIFFERENT FROM THE SECOND READ THRESHOLD VOLTAGE AND WHERE THE FIRST TECHNIQUE IS DIFFERENT FROM THE SECOND TECHNIQUE

SYSTEM AND METHOD OF DETERMINING READING VOLTAGES OF A DATA STORAGE DEVICE

FIELD OF THE DISCLOSURE

The present disclosure is generally related to a system and method of determining reading voltages of a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more.

Determining a reading voltage between an Erase (Er) state and an A state of a memory is different than determining the reading voltages between other states. The tail of the cell voltage distribution (CVD) of the Erase state is different from the tails of other states. Because most of the distribution of the Erase state is in negative voltage, and since typical flash memory systems do not have negative sensing capabilities, the erase state may be only partially detectable. Inaccurate determination of the reading voltage of the Er→A border may limit the lifetime of the flash memory.

SUMMARY

Difficulty in determining the reading voltage between the Erase state and the A state has increased with scaling of the memory technology, and generic cell voltage distribution (CVD) algorithms may not be sufficient to deal with this phenomenon. A specific method is provided to detect and negate the impact of the issues related to determining the reading voltage threshold of the Er→A state.

In a particular embodiment, a method is performed in a data storage device that includes a controller and a flash memory. The method is performed during a read threshold voltage update operation and includes determining a first read threshold voltage of a set of storage elements of a multi-level cell memory according to a first technique and determining a second read threshold voltage of the set of storage elements of the multi-level cell memory according to a second technique. The first read threshold voltage is different from the second read threshold voltage, and the first technique is different from the second technique. Using different techniques is referred to as a mixed mode method.

In another embodiment, a method is performed during a read threshold voltage update operation and includes determining cell voltage distribution data to determine a function based on a subset of a plurality of read voltages. The method generates additional CVD data based on data extrapolated using the function. The method combines the additional CVD data and the CVD data, filters the combined CVD data, and identifies read threshold voltage boundaries based on the filtered CVD data.

DETAILED DESCRIPTION

Figure 1:
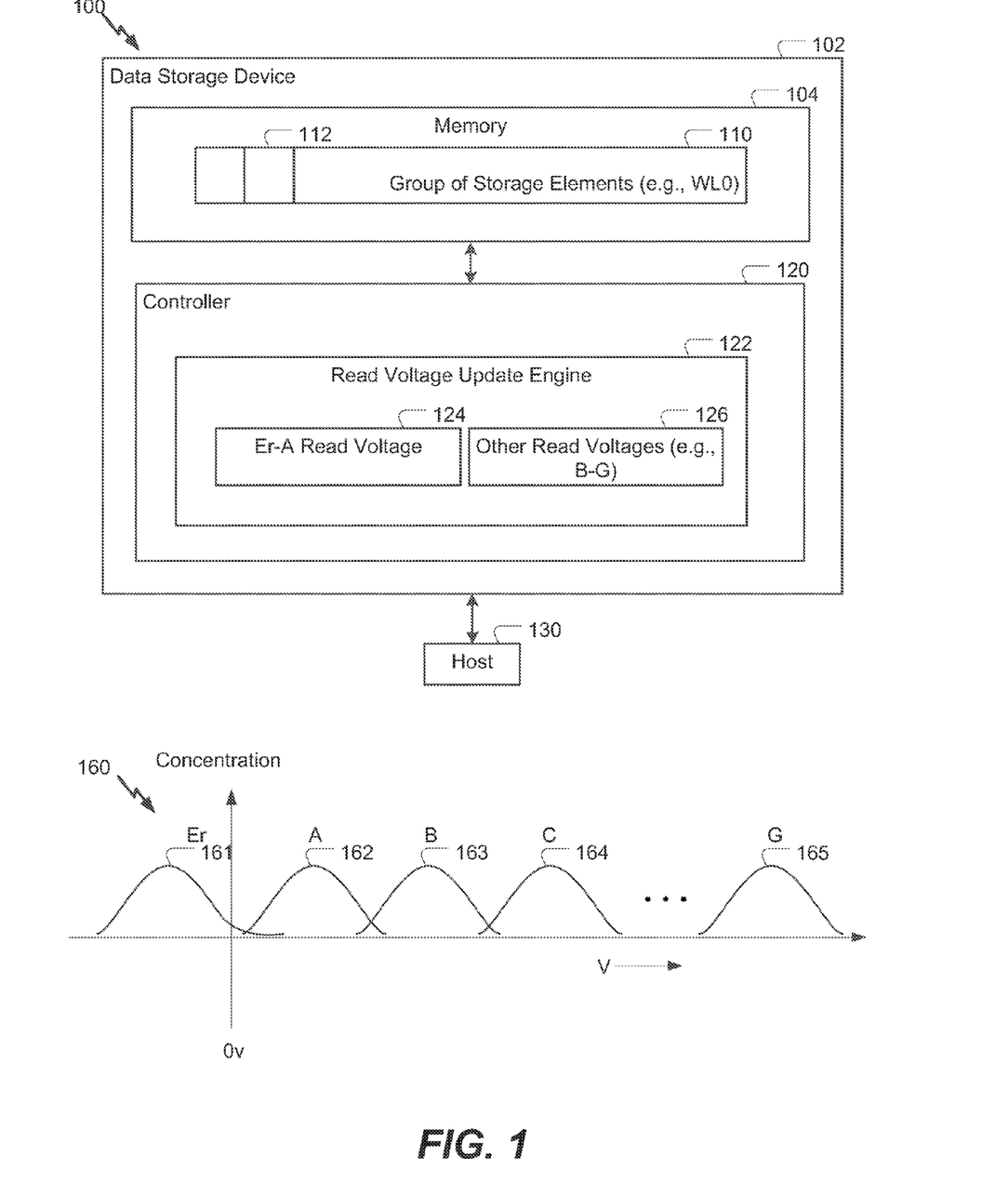
FIG. 1 is a diagram of a particular illustrative embodiment of a system including a data storage device that includes a controller configured to determine reading voltages.

Referring to FIG. 1, a particular embodiment of a system 100 includes a data storage device 102 coupled to a host device 130. The data storage device 102 includes a controller 120 that is configured to determine read voltages of a memory 104.

The host device 130 may be configured to provide data, such as user data, to be stored at the memory 104 or to request data to be read from the memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the memory 104 and writing to the memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory 104 in accordance with any other suitable communication protocol.

The memory 104 may be a non-volatile memory, such as a NAND flash memory. The memory 104 includes a representative group 110 of storage elements, such as a word line (e.g., WL0) of a multi-level cell (MLC) flash memory. The group 110 includes a representative storage element 112, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The present disclosure suggests methods to address the Er→A problem. The methods include a mixed mode method and an extrapolation method. The extrapolation method involves estimating at least a portion of the Er state distribution by extrapolating from the visible part of the ER tail. The mixed mode method involves using a first method to determine the Er→A reading voltage and using a second method for determining the other reading voltages. For example, other reading voltages may use estimation methods, such as methods for estimating the CVD of the other states.

The Er→A reading voltage may be determined by methods which may include:
  a. A bit error rate (BER) estimation method may be applied to determine the expected BER level for a number of candidate reading voltages. An Er→A reading voltage may be determined by selecting a particular candidate reading voltage that is determined to correspond to the lowest estimated BER level of the candidate reading voltages.
  b. The Er→A reading voltage may be set at a point where a predefined number of cells (e.g., ⅛ of the cells) have been turned "on" while reading with that voltage.
  c. Implement a page by page CVD estimation method, where a finer resolution, (7 or 9 or 11 bins/taps), is used for the page containing the Er→A border. Another variant of this option may generate an initial estimate of the Er→A read voltage by scanning with a coarse resolution (where the estimation method may be based on CVD estimation, or other methods), and then use a finer resolution to receive a more accurate estimate.

Using the extrapolation method, at least a portion of the Erase state distribution may be estimated by extrapolating from a visible part of the tail of the CVD distribution of the Erase State. This method builds upon the observation that computing the reading voltages for any of the state borders may include applying a smoothing filter to the estimations of the CVD. However, for the Erase state, only a limited number of estimation points are available (due to the lack of negative voltage sensing). Applying the smoothing filter to the Er→A border may result in a non-optimal reading voltage.

According to the extrapolation method, prior to applying the smoothing filter, the Erase state tail is extended (according to a linear model or any other model), to generate initial conditions for the smoothing filter. The initial conditions of the smoothing filter more closely represent the real points of the Erase CVD.

The extrapolation method is described below with reference to an example illustrated in FIG. 2.

Suppose the points $(8, h_1)$, $(16, h_2)$, $(24, h_3)$ are detected and an estimate of the points $(0, h_0)$, $(-8, h_{-1})$, $(-16, h_{-2})$, $(-24, h_{-3})$ is desired.

Assuming a linear model (descending), the estimation may be carried out by assuming the points satisfy the relation: $h_i = \alpha v_i + \beta$, using well known estimation methods for estimating $\alpha$ and $\beta$. If the estimation of $\alpha$ does not result in a negative $\alpha$, the extrapolated points may be set to 0.

Closed form equations are provided by:

$$\text{Compute } \hat{\beta} = \frac{h_1 + h_2 + h_3}{3},$$

$$\hat{\alpha} = \frac{h_3 - h_1}{16},$$

If $\hat{\alpha} < 0$: $h_0 = -16\hat{\alpha} + \hat{\beta},$ $$h_{-1} = -24\hat{\alpha} + \hat{\beta},$$

$$h_{-2} = -32\hat{\alpha} + \hat{\beta},$$

$$h_{-3} = -40\hat{\alpha} + \hat{\beta},$$

If $\hat{\alpha} \geq 0$: $h_0 = h_{-1} = h_{-2} = h_{-3} = 0$

Another model which may be used is a log linear model, where $H_i = \log(h_i)$ is linear and where $h_i = 2^{\alpha v_i + \beta}$.

In this case, the linear models for $H_i$ may be computed where $H_i = \log(h_i)$, and the parameters $H_i$ may be estimated in the same fashion as above.

In closed form equations:

$$\text{Compute } \hat{\beta} = \frac{H_1 + H_2 + H_3}{3},$$

$$\hat{\alpha} = \frac{H_3 - H_1}{16},$$

If $\hat{\alpha} < 0$: $h_0 = 2^{-16\hat{\alpha} + \hat{\beta}},$ $$h_{-1} = 2^{-24\hat{\alpha} + \hat{\beta}},$$

$$h_{-2} = 2^{32\hat{\alpha} + \hat{\beta}},$$

$$h_{-3} = 2^{-40\hat{\alpha} + \hat{\beta}},$$

If $\hat{\alpha} \geq 0$: $h_0 = h_{-1} = h_{-2} = h_{-3} = 0$

The mixed mode methods may be used selectively because the mixed mode method uses additional read operations and may take extra time. Therefore, it may be beneficial to develop strategies such that the mixed mode method is used when ordinary methods for determining the Er→A reading voltage result are not satisfactory. For example, the mixed mode method can be selectively employed according to one of the following criteria after a certain number of write/erase cycles (e.g., "hot counts"), after a failure of a first pass CVD method, or if the BER exceeds a predefined threshold. Alternatively, the mixed mode method may be used as a function of the physical address (e.g., certain word lines may require special treatment and other may not, or certain blocks, such as blocks with a fast trim, may require special treatment while blocks with ordinary trim may not).

The extrapolation method has only minor implications on the latency (e.g., may be performed without extra sensing operations and with a relatively small number of additional computations in the controller). Therefore, the extrapolation method may be used regularly (e.g., for fresh and cycled conditions).

Referring to FIG. 1, in a particular embodiment that illustrates the mixed mode method, the controller 120 includes a read voltage update engine 122 that includes a first module 124 (for updating an Er-A Read Voltage) and a second module 126 (for updating other Read Voltages (e.g., read voltages corresponding to boundaries between states B-G in a 3-bits per cell (BPC) MLC implementation)). While a 3-BPC MLC implementation has been described, it should be understood that other multi-level cell configurations, such as a 4-BPC configuration, may also be utilized.

FIG. 1 depicts a cell voltage distribution 160 associated with a plurality of cells, such as a plurality of cells of the group of storage elements 110 within the memory 104. For example, the cell voltage distribution 160 illustrates a distribution corresponding to an Erase voltage distribution 161, an "A" voltage distribution 162, a "B" voltage distribution 163, a "C" voltage distribution 164, and other voltage distributions up to a "G" voltage distribution 165. The Er state may correspond to a lowest voltage range of the states Er-G and state G may correspond to a highest voltage range of the states Er-G. Storage elements in the Er state have threshold voltages corresponding to the storage elements being erased and as illustrated may include storage elements having negative threshold values. Each of the eight states Er-G may correspond to a 3-bit value. For example, the Er state may correspond to a value of "111", the A state may correspond to a value of "110", etc.

The erase voltage distribution 161 includes a plurality of voltage values that are negative (voltage is less than 0). The voltage values that are less than 0 are illustrated by data points to the left of the axis as shown in FIG. 1.

In order to address challenges associated with processing of negative voltage values, the read voltage update engine 122 includes the particular read voltage module 124 that is used to determine and update read voltage settings for the Erase-A boundary.

During operation, the controller 120 is configured, during a read threshold voltage update operation, to determine a first read threshold voltage of a set of storage elements of a multilevel cell (MLC) memory according to a first technique. The controller 120 is also configured to determine a second read threshold voltage of the set of storage elements of the multilevel cell (MLC) memory according to a second technique. In a particular embodiment, the first read threshold voltage is different from the second read threshold voltage and the first technique is different from the second technique.

The set of storage elements may be the group of storage elements 110 within the memory 104. The memory 104 may be an MLC memory and may have a plurality of read voltage values (e.g., an Er-A read voltage, an A-B read voltage, a B-C read voltage, up to an F-G read voltage). A first technique may be used to update the Er-A read voltage and a second technique may be used to update the other read voltages. For example, in a particular embodiment, the first technique may be a CVD technique and the second technique may be a bit error rate technique. In another embodiment, either the first technique or the second technique may determine the read threshold voltage according to a fixed ratio of activated storage elements to non-activated storage elements.

In another embodiment, the first technique is a CVD technique that includes a preprocessing extrapolation operation. Further details regarding the preprocessing extrapolation operation is described and illustrated with reference to FIG. 2.

In another embodiment, the first technique is a first cell voltage distribution (CVD) technique performed at a first resolution and the second technique is a second CVD technique performed at a second resolution. For example, a resolution for the first CVD technique to update the Er-A read voltage boundary (performed by the first module 124) may have higher resolution than the CVD technique applied for the other read voltages (performed by the second module 126).

Figure 2:
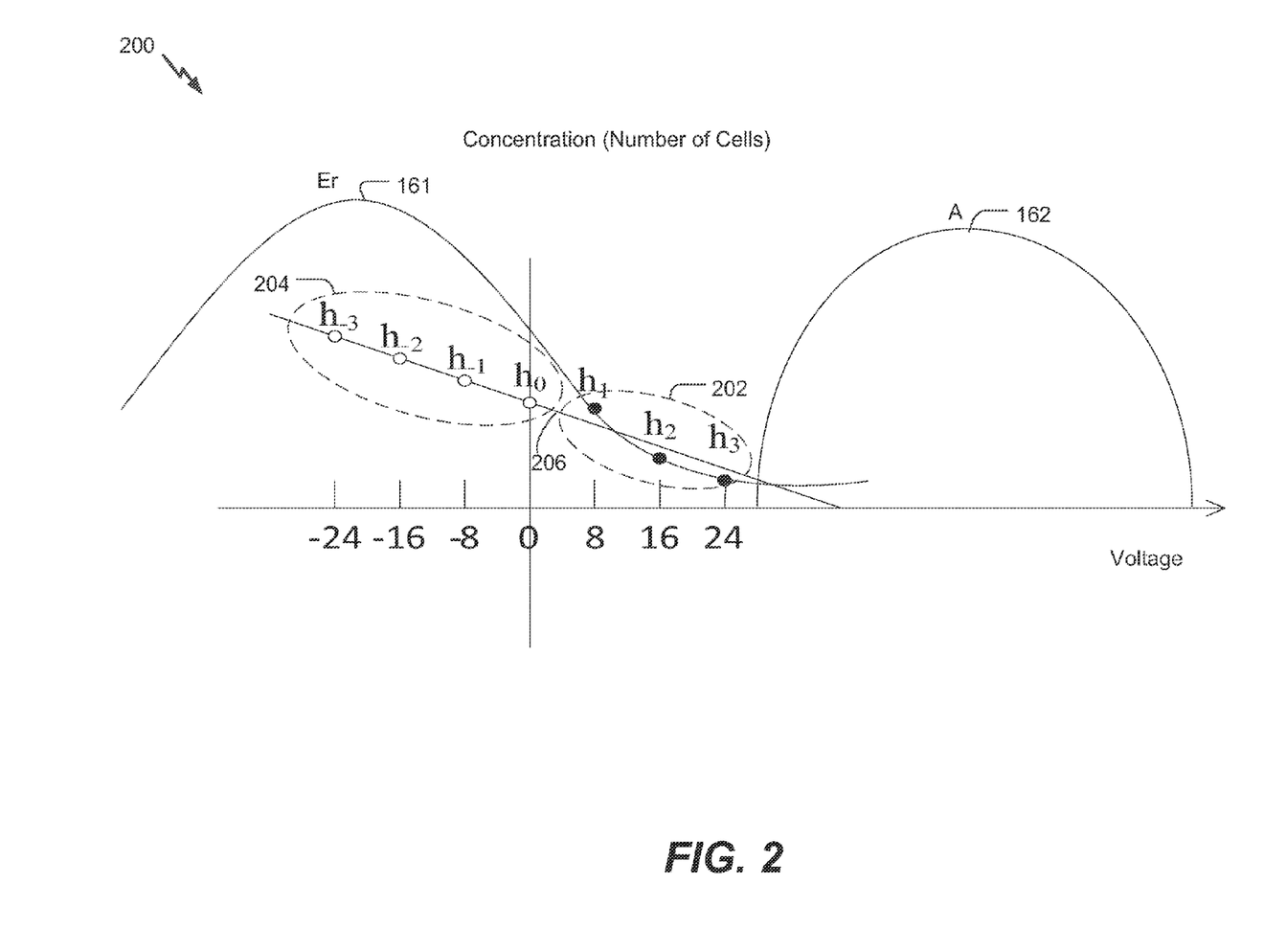
FIG. 2 is a general diagram that illustrates a method of extrapolating data from a cell voltage distribution.

FIG. 2 illustrates a cell voltage distribution 200 related to an Erase state and state A and also illustrates a graphical depiction of a preprocessing extrapolation method. While performing a cell voltage distribution update technique, a plurality of values of cells within a memory are sampled, including a first set of samples 202. The first set of samples 202 includes samples h1, h2, and h3. FIG. 2 also illustrates a second set of data 204. The second set of data 204 includes extrapolated data items. The extrapolated data items in the second set of data 204 include the illustrated data items $h_0$, $h_{-1}$, $h_{-2}$, and $h_{-3}$. The data items $h_0$, $h_{-1}$, $h_{-2}$, $h_{-3}$ are extrapolated based on a function. In a particular embodiment, the function is a linear function, such as the line 206 illustrated in FIG. 2. In other embodiments, other functions may be used, such as logarithmic functions or other nonlinear functions.

The function 206 is determined based on an interpolation of the data items within the first set of samples 202. For example, a best fit linear function may be determined by calculating a mean square error or by use of other methods to determine an interpolated line that matches, or provides a best fit, for the samples within the first set of samples 202. The illustrated function 206 is a line that is extended to provide a set of linearly mapped points corresponding to negative voltage values, as shown in FIG. 2. For example, the data points $h_0$, $h_{-1}$, $h_{-2}$, and $h_{-3}$ are extrapolated points that lie on the line 206, and the line 206 may be generated based on an interpolation of the data within the first set of samples 202. Thus, FIG. 2 illustrates generation of additional CVD data (e.g. the second set of data 204) by extrapolating data points using a function generated based on a subset of a plurality of read voltages (e.g. the first set of samples 202). For example, the additional CVD data may correspond to negative voltage values as shown. The additional CVD data may be combined with the original CVD data, and the combined CVD data may be filtered and processed in order to identify read threshold voltage boundaries. For example, the read threshold voltage boundaries may be determined by identifying relative minima of the filtered CVD data.

Figure 3:
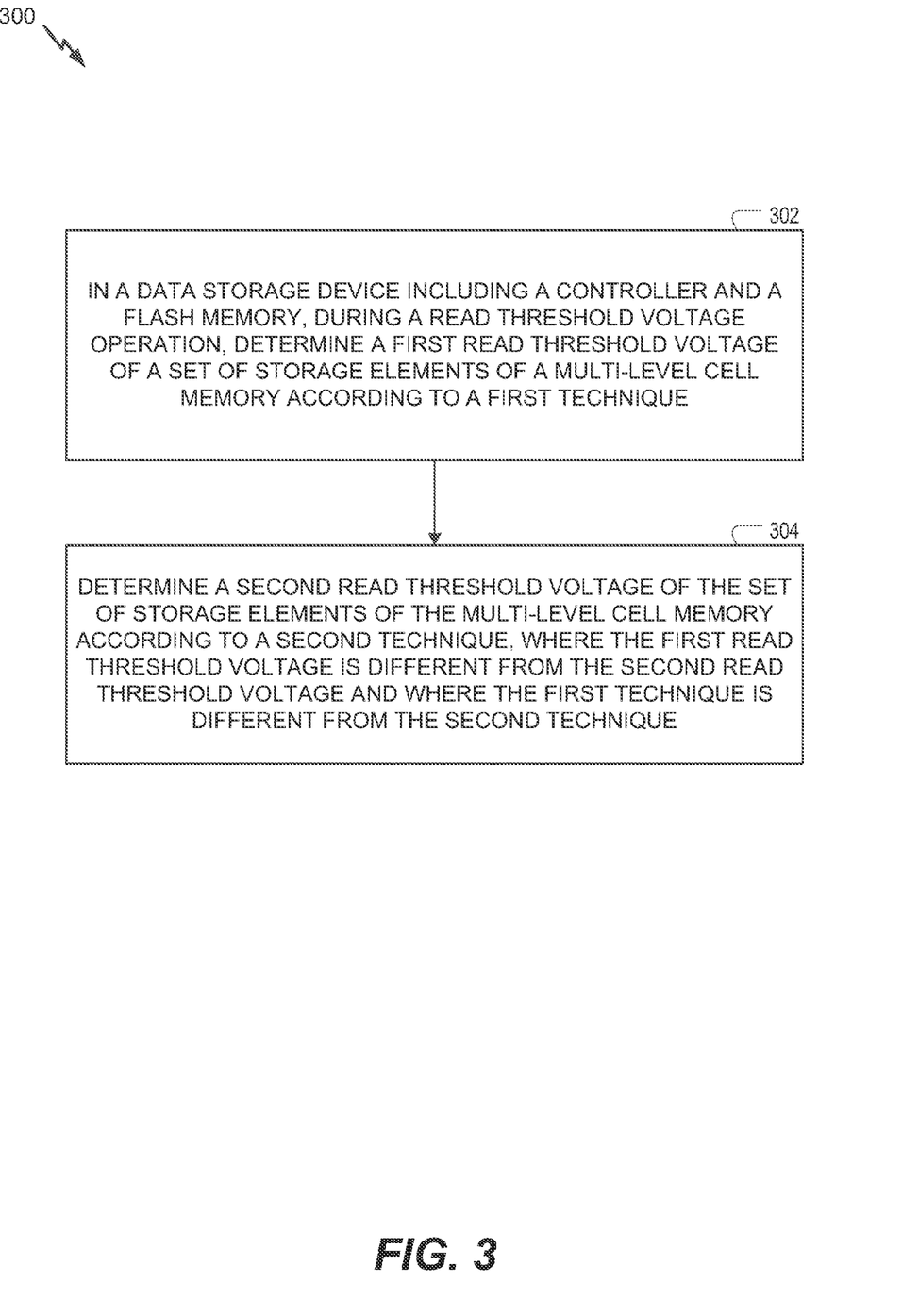
FIG. 3 is a flow chart that illustrates a particular illustrative embodiment of a method of determining read voltages of a data storage device.

FIG. 3 illustrates a particular illustrative embodiment of a method 300 of determining read threshold voltages for a memory. The method 300 may be performed in a data storage device that includes a controller and a non-volatile memory, such as the data storage device 102 of FIG. 1. The method 300 includes, during a read threshold voltage operation, determining a first read threshold voltage of a set of storage elements of a multilevel cell memory according to a first technique, at 302. For example, the Er-A read voltage module 124 within the controller 120 may determine a first read threshold voltage of a set of storage elements. For example, the set of storage elements may correspond to the group of storage elements 110.

The method 300 further includes determining a second read threshold voltage of the set of storage elements of the multilevel cell memory according to a second technique. For example, the second technique may be performed by the read voltage module 126 within the read voltage update engine 122 of the controller 120 to determine a second read threshold voltage. The first read threshold voltage is different from the second read threshold voltage, and the first technique is different from the second technique. For example, a particular technique may be used to determine the first read threshold voltage (e.g., the threshold voltage of the Erase-A boundary) while a different technique is used to determine the other read voltage thresholds (e.g., by the read voltage module 126).

In a particular embodiment, the first technique includes a preprocessing extrapolation operation, such as the interpolation and extrapolation operations described and illustrated in connection with FIG. 2. In another embodiment, the first technique is a first cell voltage distribution (CVD) technique that is performed at a higher resolution than a second technique that is used for other read voltage thresholds. The first technique is used to determine the Erase-A read voltage boundary while the other technique is used to determine the other read voltage boundaries. In another embodiment, the second technique is a bit error rate technique, a cell voltage distribution technique, or a technique that is based on fixed ratios of activated storage elements to non-activated storage elements.

Figure 4:
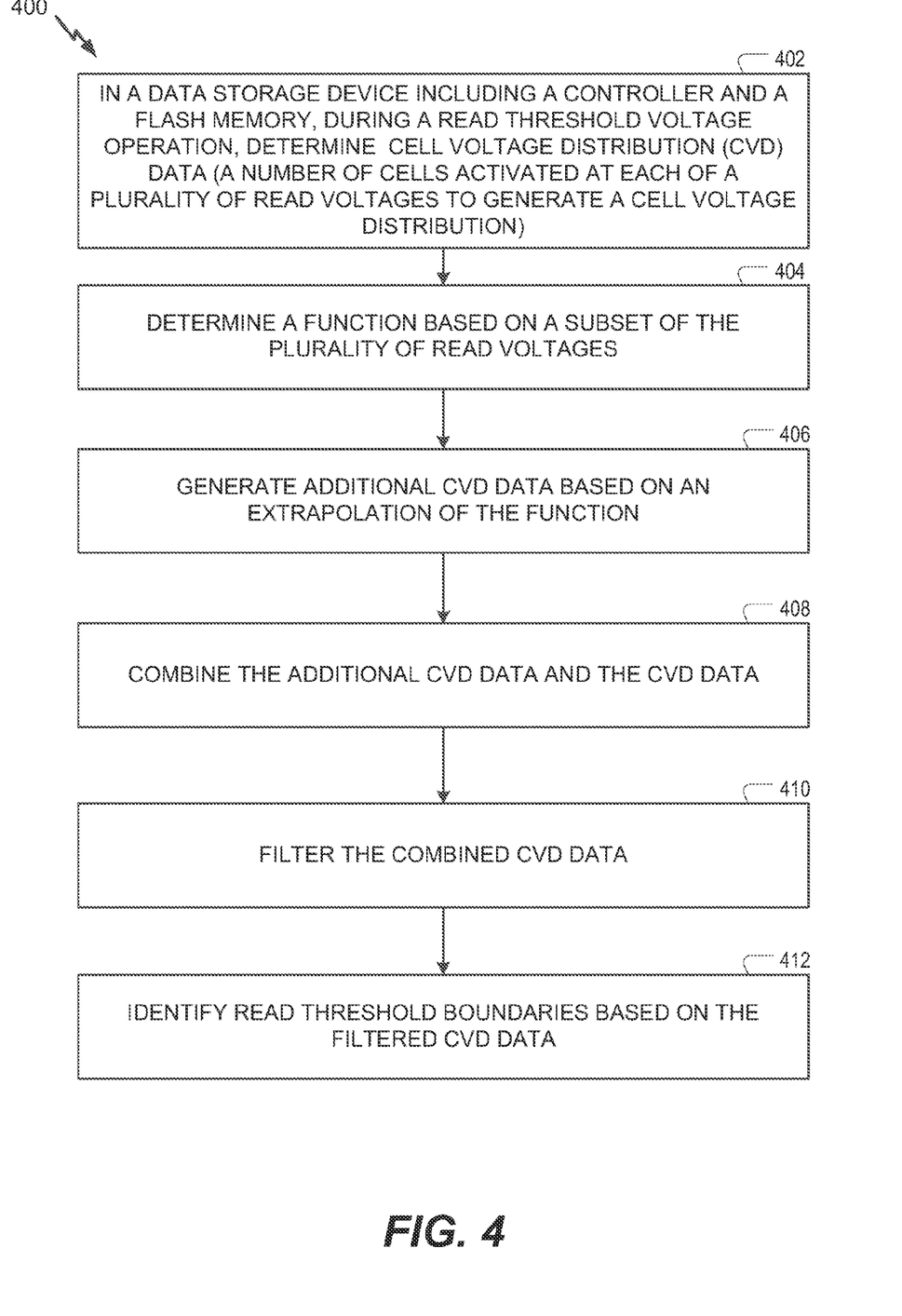
FIG. 4 is a flow chart that illustrates another particular enhancement of a method of determining read voltages of a data storage device.

Referring to FIG. 4, a particular illustrative embodiment of a method 400 of determining and updating read threshold voltages is illustrated. The method 400 may be performed by a controller within a data storage device, such as the controller 120 of the data storage device 102 of FIG. 1. The method 400 includes, during a read threshold voltage operation, determining cell voltage distribution (CVD) data (e.g., by determining a number of cells activated at each of a plurality of read voltages), at 402. The method 400 further includes determining a function based on a subset of the plurality of read voltages, at 404. For example, a linear function that is a best fit of a subset of CVD data may be determined. An example of the function is the linear function 206 illustrated in FIG. 2.

The method 400 further includes generating additional CVD data by extrapolating data using the function, at 406. For example, the additional CVD data items $h_0$, $h_{-1}$, $h_{-2}$, $h_{-3}$ are extrapolated based on the function 206. The method 400 further includes combining the additional CVD data and the CVD data, at 408. For example, an enhanced or updated CVD data distribution may be generated by combining the extrapolated data items with the original CVD data.

The method 400 further includes filtering the combined CVD data, at 410, and identifying read threshold boundaries based on the filtered CVD data, at 412. The read threshold boundaries may be identified based on evaluating the filtered CVD data to identify local minima between various regions of the CVD data, such as boundaries between each of the voltage ranges corresponding to storage element states (e.g., Erase and A-G).

Although various components depicted herein are illustrated as block components and described in general terms, such components may include one or more microprocessors, state machines, or other circuits configured to enable the controller 120 of FIG. 1 to perform mixed mode methods and extrapolation processing as described herein. For example, the controller 120 and the read voltage update engine 122 may represent physical components, such as hardware controllers, state machines, logic circuits, or other structures.

The controller 120 and the read voltage update engine 122 may be implemented using a microprocessor or microcontroller programmed to perform mixed mode methods and extrapolation processing as described herein. In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a controller and a flash memory, performing, during a read threshold voltage update operation:
   determining a first read threshold voltage of a set of storage elements of a multi-level cell memory according to a first technique, wherein the first technique determines the first read threshold voltage according to a fixed ratio of activated storage elements to non-activated storage elements; and
   determining a second read threshold voltage of the set of storage elements of the multi-level cell memory according to a second technique, wherein the first read threshold voltage is different from the second read threshold voltage, wherein the first technique is different from the second technique, and wherein the data is retrievable from a storage element of the set of storage elements by use of a read operation that uses the first read threshold voltage and the second read threshold voltage.

2. The method of claim 1, wherein the first technique is a bit error rate technique.

3. The method of claim 1, wherein the first technique includes a pre-processing extrapolation operation.

4. The method of claim 1, wherein the first technique is a first cell voltage distribution technique performed at a first resolution, and wherein the second technique is a second cell voltage distribution technique performed at a second resolution.

5. The method of claim 1, wherein the second technique is a bit error rate technique, a cell voltage distribution technique, or a technique based on fixed ratios of activated storage elements to non-activated storage elements.

6. The method of claim 1, wherein the first read threshold voltage defines an Erase state boundary.

7. A method comprising:
   in a data storage device including a controller and a flash memory, performing, during a read threshold voltage update operation:
   interpolating cell voltage distribution (CVD) data corresponding to an Erase state to determine a function;
   generating additional CVD data by extrapolating using the function;

combining the additional CVD data and the CVD data;
filtering the combined CVD data; and
identifying read threshold voltage boundaries based on the filtered CVD data.

8. The method of claim 7, wherein the function is linear.

9. The method of claim 7, wherein the function is logarithmic.

10. The method of claim 7, wherein the additional CVD data corresponds to negative read voltage values associated with an Erase state of the flash memory.

11. The method of claim 7, wherein the additional CVD data corresponds to a first read threshold voltage that defines an Erase state.

12. A data storage device comprising:
a flash memory; and
a controller coupled to the flash memory, wherein the controller is configured to, during a read threshold voltage update operation, determine a first read threshold voltage of a set of storage elements of the flash memory according to a first technique and to determine a second read threshold voltage of the set of storage elements according to a second technique, wherein the first technique includes a pre-processing extrapolation operation, wherein the first read threshold voltage is different from the second read threshold voltage, wherein the first technique is different from the second technique, and wherein after determining the first read threshold voltage and the second read threshold voltage, data is read from a storage element of the set of storage elements during a read operation, and wherein the read operation uses the first read threshold voltage and the second read threshold voltage.

13. The data storage device of claim 12, wherein the first technique is a bit error rate technique.

14. The data storage device of claim 12, wherein the first technique determines the first read threshold voltage according to a fixed ratio of activated storage elements to non-activated storage elements.

15. The method of claim 7, wherein extrapolating using the function includes generating, based on the function, at least one data point corresponding to a negative threshold voltage, and wherein combining the additional CVD data and the CVD data includes grouping the at least one data point with data points of the CVD data corresponding to positive threshold voltages.

16. The data storage device of claim 12, wherein the first technique is a first cell voltage distribution technique performed at a first resolution, and wherein the second technique is a second cell voltage distribution technique performed at a second resolution.

17. The data storage device of claim 12, wherein the second technique is a bit error rate technique, a cell voltage distribution technique, or a technique based on fixed ratios of activated storage elements to non-activated storage elements.

18. The data storage device of claim 12, wherein the first read threshold voltage defines an Erase state boundary.

19. A method comprising:
in a data storage device including a controller and a flash memory, performing, during a read threshold voltage update operation:
determining a first read threshold voltage of a set of storage elements of a multi-level cell memory according to a first technique; and
determining a second read threshold voltage of the set of storage elements of the multi-level cell memory according to a second technique, wherein the first read threshold voltage is different from the second read threshold voltage, wherein the first technique is different from the second technique, wherein the first technique is a first cell voltage distribution technique performed at a first resolution and the second technique is a second cell voltage distribution technique performed at a second resolution, and wherein the data is readable from a storage element of the set of storage elements by use of a read operation that uses the first read threshold voltage and the second read threshold voltage.

20. The method of claim 19, wherein the first read threshold voltage defines an Erase state boundary.

21. A data storage device comprising:
a flash memory; and
a controller coupled to the flash memory, wherein the controller is configured to, during a read threshold voltage update operation, determine a first read threshold voltage of a set of storage elements of the flash memory according to a first technique and to determine a second read threshold voltage of the set of storage elements according to a second technique, wherein the first read threshold voltage is different from the second read threshold voltage, wherein the first technique is different from the second technique, wherein the second technique is a bit error rate technique, a cell voltage distribution technique, or a technique based on fixed ratios of activated storage elements to non-activated storage elements, and wherein the data is retrievable from a storage element of the set of storage elements by use of a read operation that uses the first read threshold voltage and the second read threshold voltage.

22. The data storage device of claim 21, wherein the first read threshold voltage defines an Erase state boundary.

23. A data storage device comprising:
a flash memory; and
a controller coupled to the flash memory, wherein the controller is configured to, during a read threshold voltage update operation, determine a first read threshold voltage of a set of storage elements of the flash memory according to a first technique and to determine a second read threshold voltage of the set of storage elements according to a second technique, wherein the first read threshold voltage is different from the second read threshold voltage, wherein the first read threshold voltage defines an Erase state boundary, wherein the first technique is different from the second technique, and wherein the data is retrievable from a storage element of the set of storage elements by use of a read operation that uses the first read threshold voltage and the second read threshold voltage.

24. The data storage device of claim 12, wherein the first read threshold voltage defines an Erase state boundary.

* * * * *